(12) United States Patent
Doornbos et al.

(10) Patent No.: US 9,337,109 B2
(45) Date of Patent: May 10, 2016

(54) MULTI-THRESHOLD VOLTAGE FETS

(71) Applicant: Taiwan Semiconductor Manufacturing Company, Ltd., Hsin-Chu (TW)

(72) Inventors: Gerben Doornbos, Leuven (BE); Krishna Kumar Bhuwalka, Leuven (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/902,326

(22) Filed: May 24, 2013

(65) Prior Publication Data

US 2014/0346564 A1     Nov. 27, 2014

(51) Int. Cl.
*H01L 29/82*       (2006.01)
*H01L 21/00*       (2006.01)
(Continued)

(52) U.S. Cl.
CPC   *H01L 21/823821* (2013.01); *H01L 21/823412* (2013.01); *H01L 27/0605* (2013.01); *H01L 27/0924* (2013.01); *H01L 29/1054* (2013.01)

(58) Field of Classification Search
CPC ............... H01L 29/7783; H01L 27/10826; H01L 29/785; H01L 21/02538; H01L 2924/01031; H01L 21/02463; H01L 21/02546; H01L 21/02551; H01L 21/8238; H01L 29/452; H01L 29/7849; H01L 27/088
USPC ................................................. 257/185–195
See application file for complete search history.

(56) References Cited

U.S. PATENT DOCUMENTS 5,206,528 A * 4/1993 Nashimoto ................ 257/192
7,265,012 B2 * 9/2007 Helm et al. ................ 438/231
(Continued)

FOREIGN PATENT DOCUMENTS

KR    20060035746        4/2006
KR    20090076972 A      7/2009
(Continued)

OTHER PUBLICATIONS

First Experimental Demonstration of 100 nm Inversion-mode InGaAs FinFET through Damage-free Sidewall Etching Y.Q. Wu, R.S. Wang, T. Shen, J.J. Gu and P. D. Ye 97-4244-5640-6/09/ © 2009 IEEE, pp. 331-334.*

(Continued)

*Primary Examiner* — Howard Weiss
*Assistant Examiner* — Nelson Garces
(74) *Attorney, Agent, or Firm* — Slater & Matsil, L.L.P.

(57) ABSTRACT

A multi-threshold voltage ($V_t$) field-effect transistor (FET) formed through strain engineering is provided. An embodiment integrated circuit device includes a first transistor including a first channel region over a first buffer, the first channel region formed from a III-V semiconductor material and a second transistor including a second channel region over a second buffer, the second channel region formed from the III-V semiconductor material, the second buffer and the first buffer having a lattice mismatch. A first strain introduced by a lattice mismatch between the III-V semiconductor material and the first buffer is different than a second strain introduced by a lattice mismatch between the III-V semiconductor material and the second buffer. Therefore, the threshold voltage of the first transistor is different than the threshold voltage of the second transistor.

20 Claims, 19 Drawing Sheets

(51) Int. Cl.
  *H01L 27/092* (2006.01)
  *H01L 21/336* (2006.01)
  *H01L 21/8234* (2006.01)
  *H01L 21/8238* (2006.01)
  *H01L 27/06* (2006.01)
  *H01L 29/10* (2006.01)

(56) References Cited

U.S. PATENT DOCUMENTS

| | | | |
|---|---|---|---|
| 2005/0017377 A1 | 1/2005 | Joshi et al. | |
| 2005/0218455 A1* | 10/2005 | Maeda | H01L 21/823807 257/368 |
| 2006/0237801 A1* | 10/2006 | Kavalieros et al. | 257/388 |
| 2008/0116485 A1 | 5/2008 | Hudait et al. | |
| 2010/0163847 A1 | 7/2010 | Majhi et al. | |
| 2010/0193771 A1* | 8/2010 | Majhi et al. | 257/24 |
| 2011/0156154 A1* | 6/2011 | Hoentschel | H01L 21/28079 257/369 |
| 2012/0086059 A1* | 4/2012 | Dubourdieu | H01L 21/28291 257/295 |
| 2013/0099282 A1 | 4/2013 | Chen et al. | |
| 2013/0134520 A1* | 5/2013 | Maeda et al. | 257/368 |
| 2014/0227845 A1* | 8/2014 | Liu | H01L 21/823418 438/276 |

FOREIGN PATENT DOCUMENTS

| | | |
|---|---|---|
| KR | 20110099798 | 9/2011 |
| KR | 20130043543 A | 4/2013 |

OTHER PUBLICATIONS

Taur, Yuan, "An Analytical Solution to a Double-Gate MOSFET with Undoped Body," 2000, Electron Device Letters, IEEE, vol. 21, Issue 5, pp. 245-247.

* cited by examiner

MULTI-THRESHOLD VOLTAGE FETS

BACKGROUND

A field-effect transistor (FET) may be designed to have a particular threshold voltage ($V_t$). For example, the transistor may have a low threshold voltage (LVT), a standard threshold voltage (SVT), or a high threshold voltage (HVT). The particular threshold voltage chosen for a transistor may depend on the speed or power characteristic desired.

In bulk silicon (Si) technology, transistors having the various threshold voltage flavors may be created by varying channel doping (e.g., well, $V_t$-adjust, halo).

Unfortunately, channel doping is not well-suited to thin-body devices such as a fin FET (FinFET) or a quantum well FET (QWFET). Therefore, gate length tuning ($L_g$-tuning) or gate work function tuning may be used to modulate threshold voltage for those devices.

For a p-type FET (PFET), a silicon germanium (SiGe) channel may be used to decrease the threshold voltage. Indeed, the valence band (VB) in the SiGe moves up with regard to silicon.

All in all, threshold voltage tuning is generally well established for silicon (Si) complimentary metal-oxide-semiconductor (CMOS) devices.

BRIEF DESCRIPTION OF THE DRAWINGS

For a more complete understanding of the present disclosure, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

While threshold voltage tuning may be generally well established for silicon (Si) complimentary metal-oxide-semiconductor (CMOS) devices, the same is not believed to be true for CMOS devices incorporating III-V semiconductor materials. Indeed, the use of existing threshold tuning methods with III-V CMOS devices has significant disadvantages.

For example, doping (e.g., ion implantation and a thermal anneal) for threshold voltage tuning is difficult in III-V CMOS devices and generally ineffective in a thin-body FET (e.g., FinFET, QWFET, nanowire FET). In addition, gate length tuning is not well suited as it complicated the lithography process and relies on threshold voltage/gate length dependence, which is undesirable due to the added variability involved. Further, gate work function tuning has a small threshold voltage window and is not always chemically stable. Still further, the use of different channel material (c.f., silicon germanium (SiGe) and silicon (Si)) for threshold voltage tuning requires different gate stack passivation, contacting, and so on.

In addition to the above, there does not appear to be a suitable solution for multiple threshold voltage implementations in the III-V CMOS device.

As will be more fully explained below, the present disclosure details the use of strain-induced band shifts to obtain multiple threshold voltages in an integrated circuit device incorporating III-V semiconductor materials. The present disclosure will be described with respect to embodiments in a specific context, namely a FinFET and a QWFET. However, the disclosure may also be applied to other integrated circuits, electronic structures, and the like.

Figure 1:
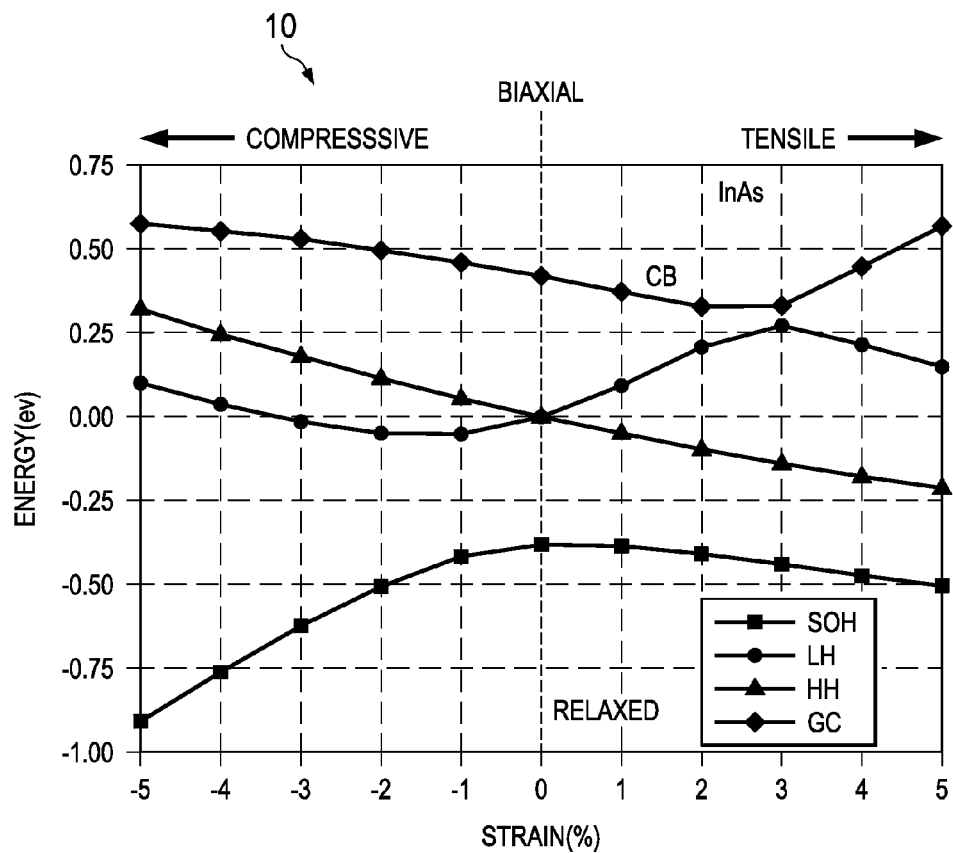
FIGS. 1-3 illustrate band structure simulations for indium arsenide (InAs)
Figure 2:
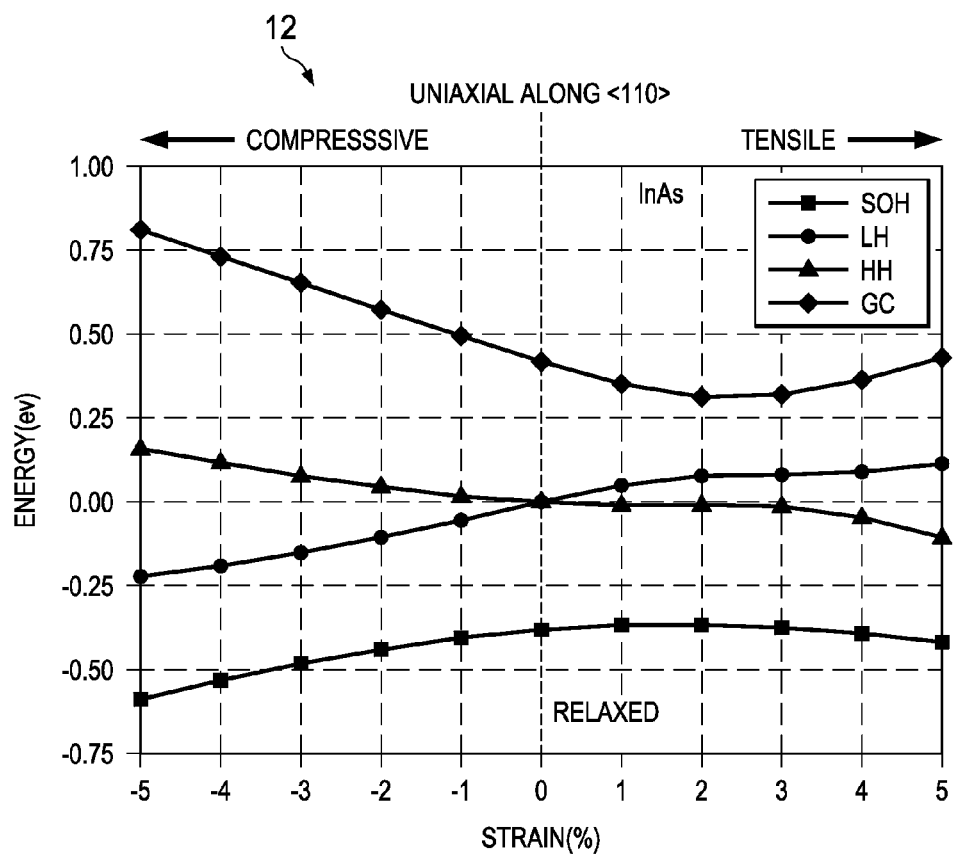
Figure 3:
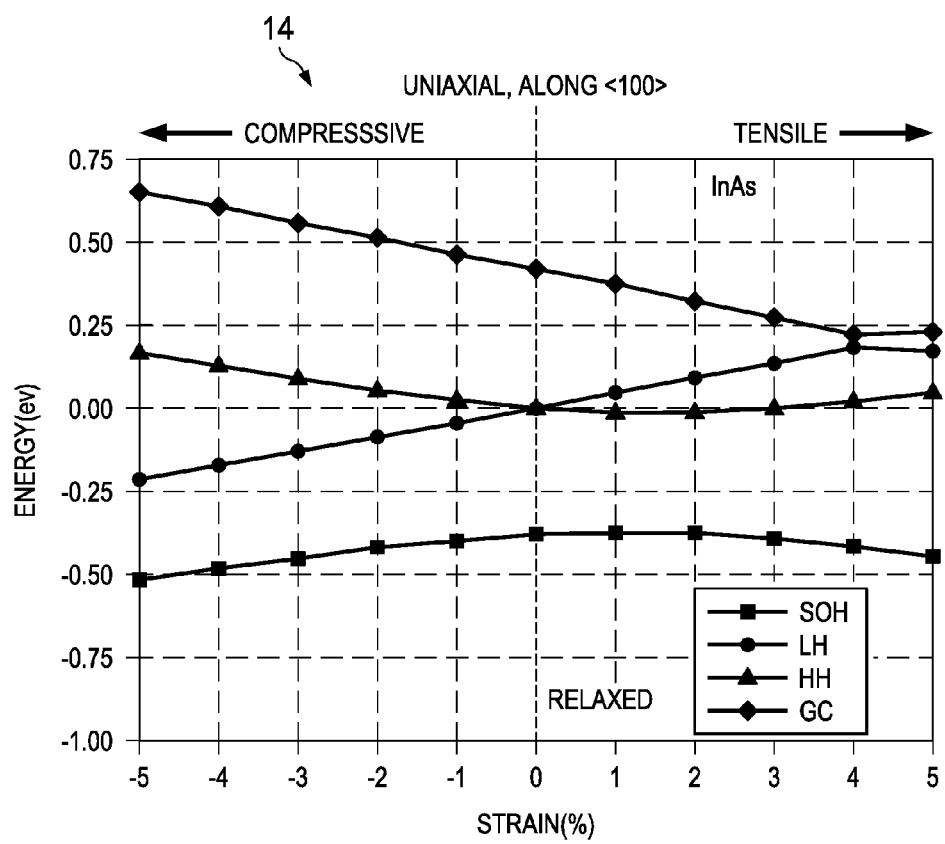

Referring now to FIGS. 1-3, band structure simulations 10, 12, 14 of indium arsenide (InAs) as a potential channel under strain are illustrated. While FIGS. 1-3 depict simulations for indium arsenide, indium gallium arsenide (InGaAs) and indium gallium antimonide (InGaSb) are believed to behave in a similar manner.

Notably, the band structure simulation 10 in FIG. 1 pertains to a wide device (e.g., QWFET) under biaxial strain, while the band structure simulations 12, 14 in FIGS. 2-3 pertain to a narrow device (e.g., FinFET) under uniaxial strain along the <110> crystal orientation and the <100> crystal orientation, respectively.

The conduction band (CB) is generally considered when designing NFET devices. As shown in FIGS. 1-3, starting from a relaxed state (i.e., no strain), the conduction band generally moves up (lower electron affinity $X_e$) for compressive strain and generally moves down (higher electron affinity $X_e$) for tensile strain.

The valence band (VB) is generally considered when constructing PFET devices, which are typically compressively strained. Like the conduction band, the valence band also moves. However, the effect is complicated due the light hole (LH) and the heavy hole (HH) band, which pertain to the valence band, splitting. Indeed, while the light hole and the heavy hole bands coincide with each other at the relaxed line when no strain is present, the light hole and the heavy hole bands diverge from each other when strain is introduced. For the purposes of reference and completeness, the split off hole (SOH) band is also depicted in FIGS. 1-3.

So, from FIGS. 1-3, it should be recognized and understood that the various bands in the band structure simulations 10, 12, 14 can be moved by adding strain, either compressive or tensile. In other words, the conduction and the valence band move in energy space as a function of strain.

Figure 4:
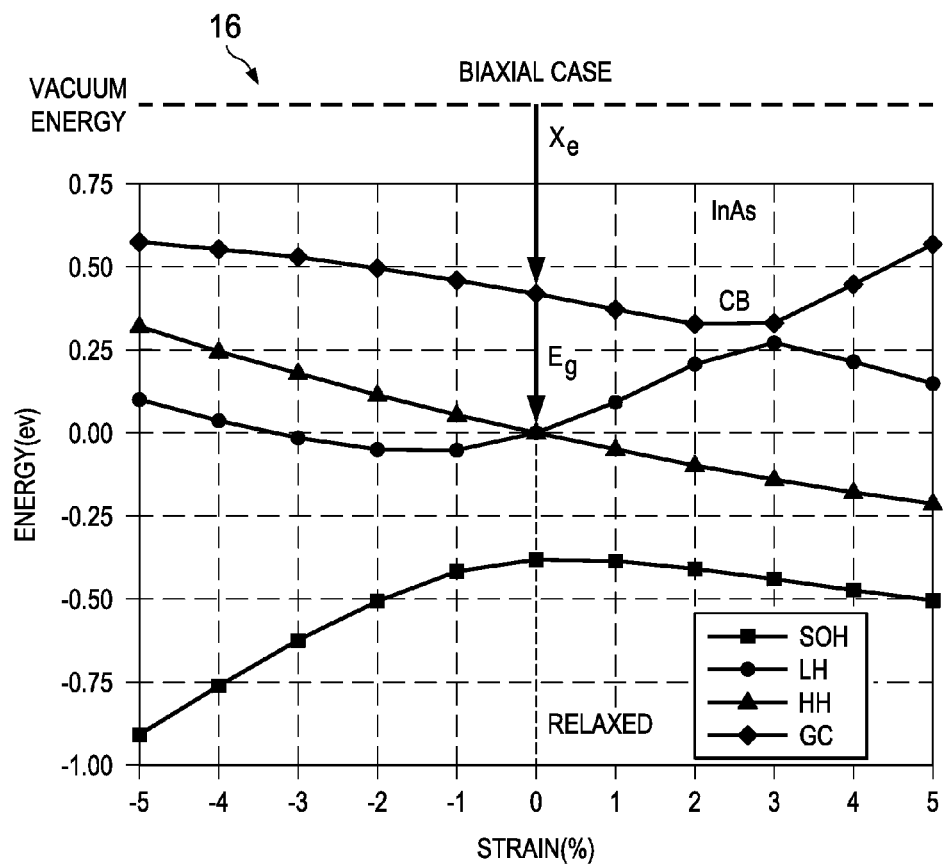
FIG. 4 illustrates an annotated version of the band structure simulation of FIG. 1.

Referring now to FIG. 4, the band structure simulation 10 of FIG. 1 is reproduced and annotated to illustrate a band structure simulation 16 with additional information. In FIG. 4, the vertical distance between the conduction band and the highest valence band (e.g., the light hole or heavy hole) represents the band gap ($E_g$). In FIG. 4, the band gap is approximately 0.4 electron volts (eV). In addition, the vertical distance between the vacuum energy and the conduction band represents the electron affinity ($X_e$).

In an NFET, the threshold voltage ($V_t$) depends on the electron affinity. In particular, a low electron affinity correlates to a high threshold voltage, $V_t$. In a PFET, the threshold voltage depends on the electron affinity and the band gap together. Therefore, a high electron affinity and band gap sum correlates to a high absolute threshold voltage $|V_t|$.

Figure 5:
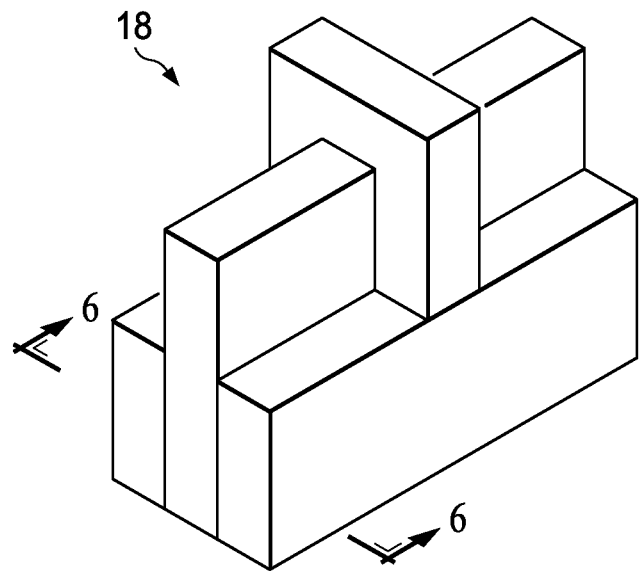
FIG. 5 illustrates an n-type FinFET.
Figure 7:
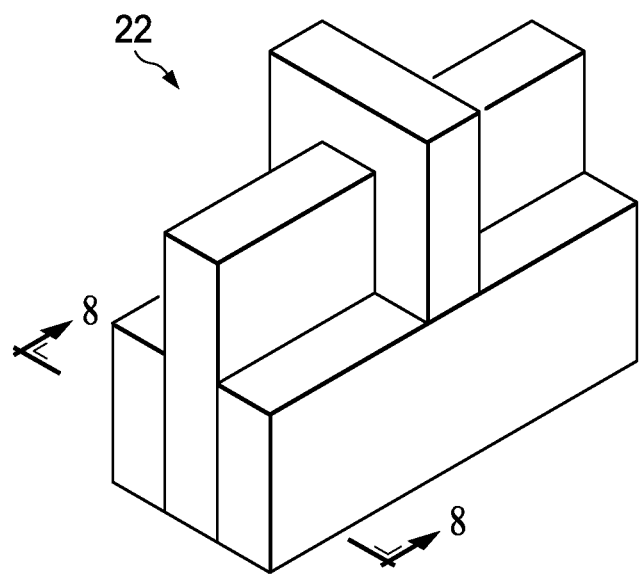
FIG. 7 illustrates a p-type FinFET.
Figure 6:
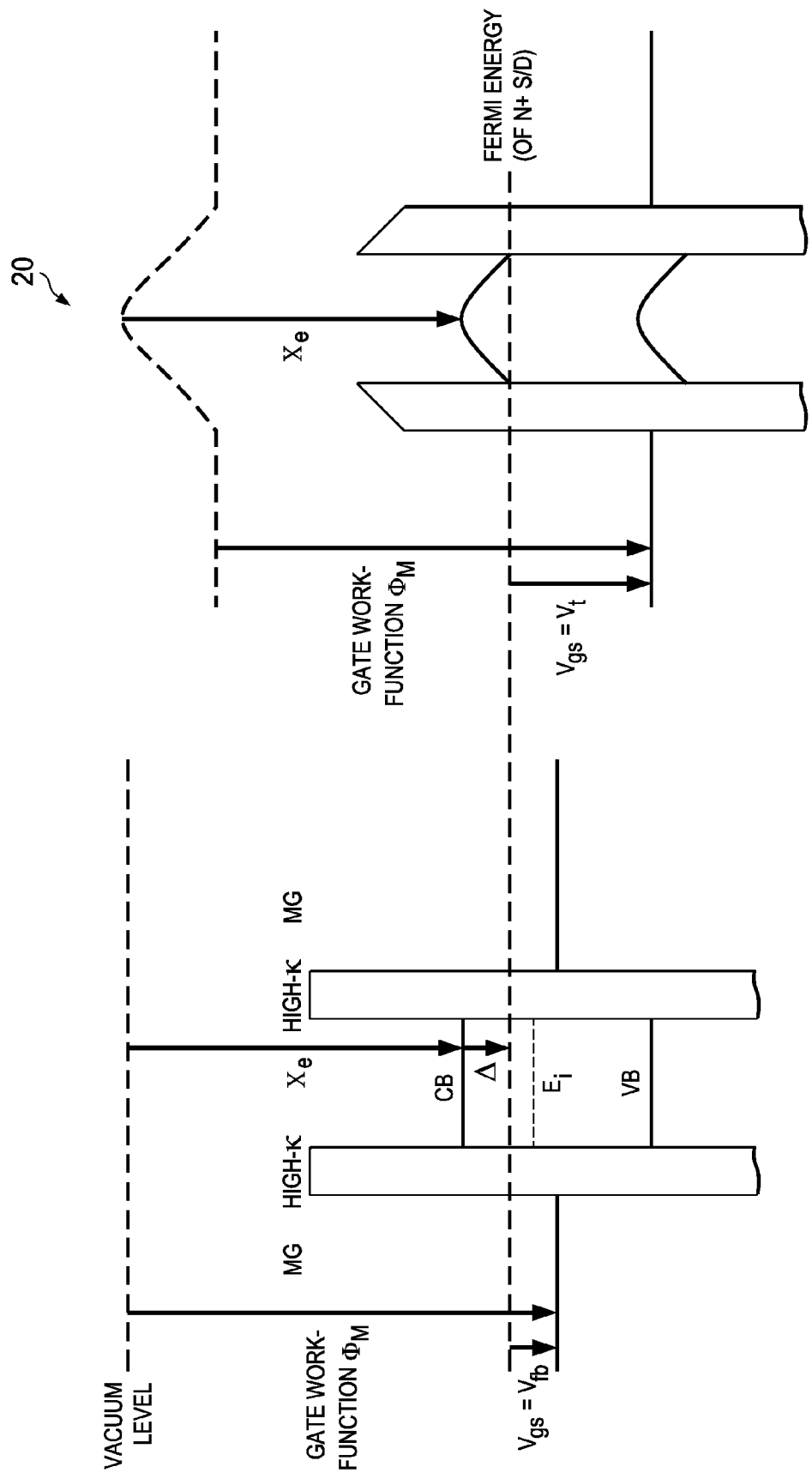
FIG. 6 illustrates a band diagram corresponding to the n-type FinFET of FIG. 5.
Figure 8:
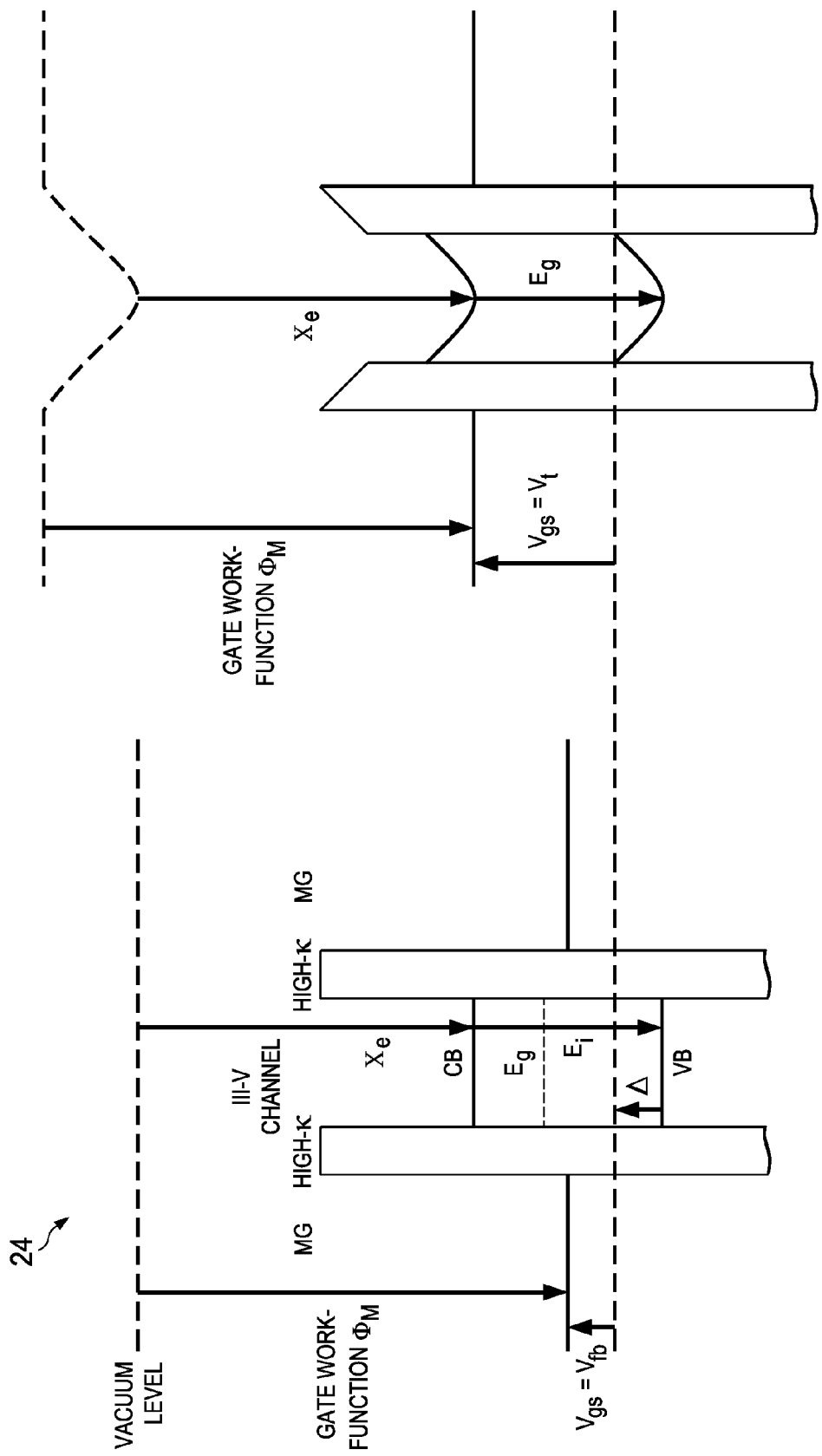
FIG. 8 illustrates a band diagram corresponding to the p-type FinFET of FIG. 7.

Referring now to FIG. 5, an n-type FinFET 18 is illustrated. In FIG. 6, a band diagram 20 illustrates the n-type FinFET of FIG. 5 when the device is in an off state (left diagram) and in an on state (right diagram). Referring now to FIG. 7, a p-type FinFET 22 is illustrated. In FIG. 8, a band diagram 24 illustrates the p-type FinFET when the device is in an off state (left diagram) and in an on state (right diagram).

From FIGS. 5-8, it should be recognized that the threshold voltage is linked to the electron affinity for NFETs and to the electron affinity and band gap sum for PFETs. In other words, if mechanical strain is applied the band gap and/or the electron affinity change, which changes the threshold voltage. Indeed, if the bands in FIGS. 6 and 8 can be manipulated (i.e., moved up and down), the threshold voltage for the device can be manipulated.

Figure 9:
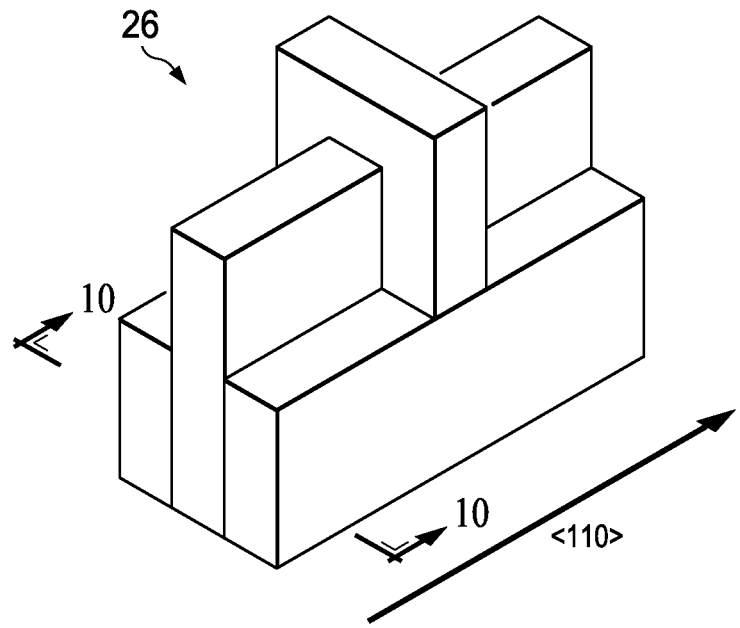
FIG. 9 illustrates a FinFET with a <110> crystal orientation in a direction corresponding to a length of the fin.

Referring now to FIG. 9, a FinFET 26 is illustrated. The FinFET 26 has a <110> crystal orientation in the direction indicated by the arrow. In an embodiment, and as will be more fully explained below, the lattice mismatch between semiconductor materials in the FinFET 26 involves heterogeneous epitaxy which may involve aspect ratio trapping (ART).

Figure 10:
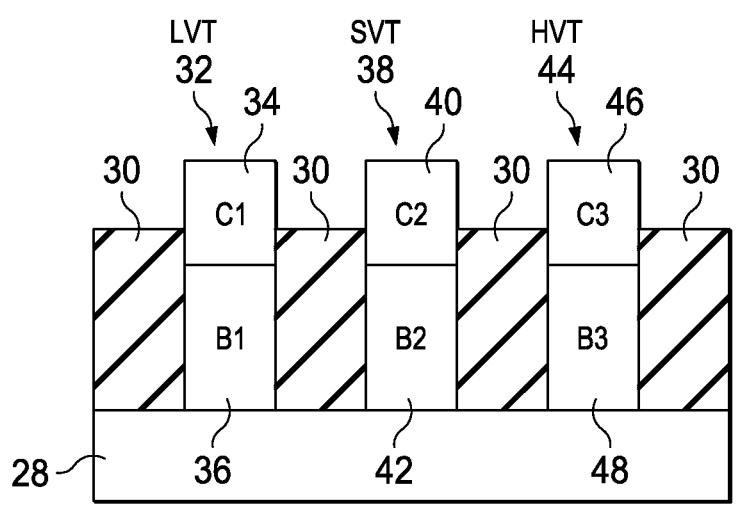
FIG. 10 illustrates a cross section of the FinFET of FIG. 9.

In FIG. 10, several of the FinFETs 26 from FIG. 9 are illustrated in cross section. As shown in FIG. 10, a substrate 28 supports an insulation region 30. In an embodiment, the substrate 28 is silicon (Si) and the insulation region 30 is a shallow trench isolation (STI) region. Even so, the substrate 28 and the insulation region 30 may be formed using other suitable semiconductor and insulating materials, respectively.

Still referring to FIG. 10, a first transistor 32 has a channel 34 disposed over a buffer 36, a second transistor 38 has a channel 40 disposed over a buffer 42, and a third transistor 44 has a channel 46 disposed over a buffer 48. In an embodiment, each of the channels 34, 40, 46 comprises the same III-V semiconductor material (i.e., material C1=C2=C3). In contrast, each of the buffers 36, 42, 48 comprises a different buffer material or buffer material compound (e.g., lattice constants of $B_1 > B_2 > B_3$). Therefore, a lattice mismatch exists between the different buffers 36, 42, 48.

In addition to the above, a lattice mismatch is also present between the channel 34 and the buffer 36 in the first transistor 32, the channel 40 and the buffer 42 in the second transistor 38, and channel 46 and the buffer 48 in the third transistor 44. As such, each of the transistors 32, 38, 44 in FIG. 10 experiences different strain, and as such has a different threshold voltage. For example, the first transistor 32 has a low threshold voltage (LVT), the second transistor 38 has a standard threshold voltage (SVT), and the third transistor 44 has a high threshold voltage (HVT). Indeed, if lattice constants of $B_1 > B_2 > B_3$, then the strain in channel 34 is greater than the strain in channel 40 and the strain in channel 40 is greater than the strain in channel 46 (i.e., strain C1>C2>C3).

Figure 11:
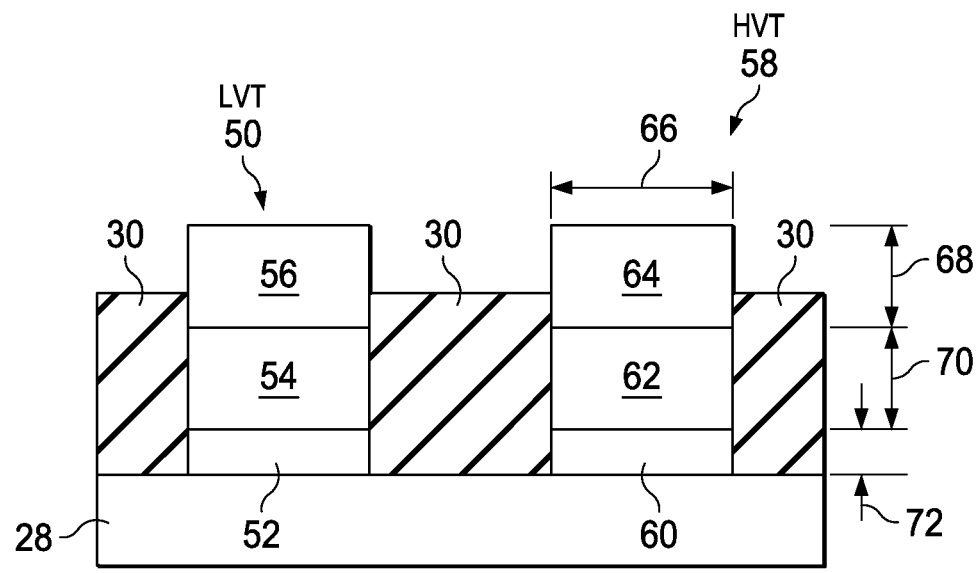
FIGS. 11-13 illustrate an embodiment n-type FinFET.

Referring now to FIG. 11, several of the FinFETs 26 from FIG. 9 are illustrated in cross section. As shown, the first transistor 50 includes a template 52 of indium arsenide (InAs), a buffer 54 of aluminum arsenide antimonide with a particular composition (e.g., $AlAs_{0.16}Sb_{0.84}$), and a channel 56 of indium arsenide (InAs). The second transistor 58 includes a template 60 of indium phosphide (InP), a buffer 62 of indium aluminum arsenide with a particular composition (e.g., $In_{0.52}Al_{0.48}As$), and a channel 64 of indium arsenide (InAs). As such, if used as n-channel FETs, the first transistor 50 has a low threshold voltage and the second transistor 58 has a high threshold voltage.

In an embodiment, the first and second transistors 50, 58 have a fin width 66 of between about 5 nm and about 20 nm, a channel height 68 of between about 10 nm and about 40 nm, a buffer height 70 of between about 100 nm and about 300 nm, and a template height 72 of between about 0 nm and about 100 nm. The device dimensions may be applicable to other embodiment devices disclosed herein, but are not repeated for brevity. In addition, the dimensions are representative only and may change depending on desired device characteristics, manufacturing limitations, and so on. Further, the templates disclosed herein are optional structures.

Figure 12:
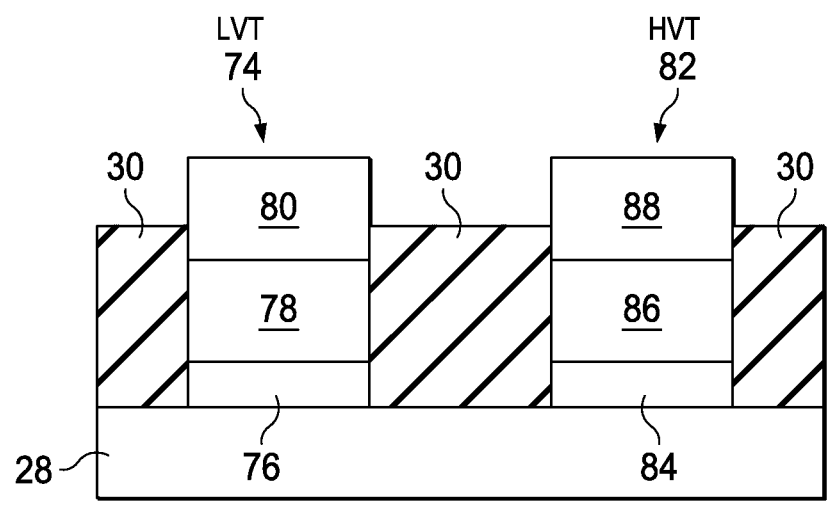

Referring now to FIG. 12, several of the FinFETs 26 of FIG. 9 are illustrated. As shown, the first transistor 74 includes a template 76 of indium arsenide (InAs), a buffer 78 of aluminum arsenide antimonide with a particular composition (e.g., $AlAs_{0.16}Sb_{0.84}$), and a channel 80 of indium gallium arsenide in a particular composition ($In_{0.7}Ga_{0.3}As$). The second transistor 82 includes a template 84 of indium phosphide (InP), a buffer 86 of indium aluminum arsenide with a particular composition (e.g., $In_{0.52}Al_{0.48}As$), and channel 88 of indium gallium arsenide in a particular composition ($In_{0.7}Ga_{0.3}As$). As such, if used as n-channel FETs, the first transistor 74 has a low threshold voltage and the second transistor 82 has a high threshold voltage.

Figure 13:
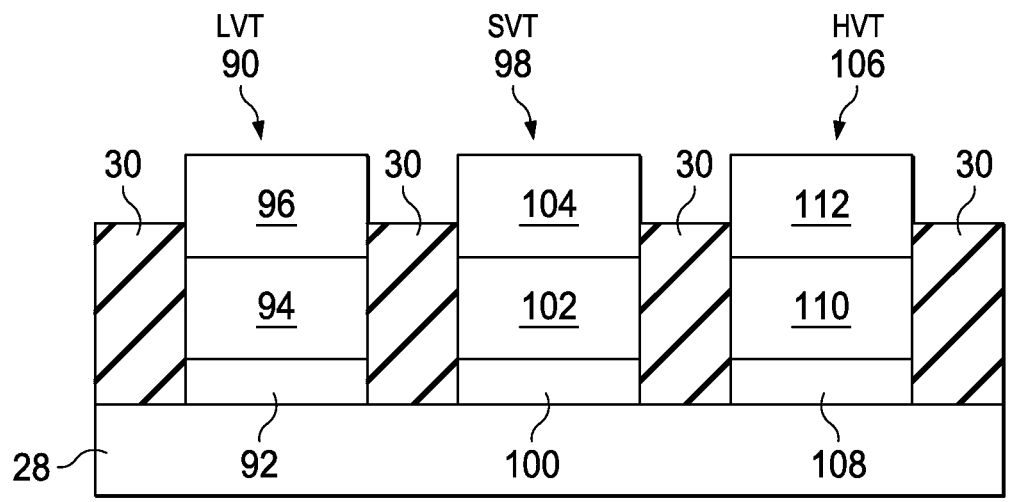

Referring now to FIG. 13, several of the FinFETs 26 of FIG. 9 are illustrated. As shown, the first transistor 90 includes a template 92 of indium phosphide (InP), a buffer 94 of indium aluminum arsenide with a particular composition (e.g., $In_xAl_{1-x}As$, with x>0.52), and a channel 96 of indium gallium arsenide (InGaAs). The second transistor 98 includes a template 100 of indium phosphide (InP), a buffer 102 of indium aluminum arsenide with a particular composition (e.g., $In_{0.52}Al_{0.48}As$), and a channel 104 of indium gallium arsenide (InGaAs). The third transistor 106 includes a template 108 of indium phosphide (InP), a buffer 110 of indium aluminum arsenide with a particular composition (e.g., $In_yAl_{y-1}As$, with y<0.52), and a channel 112 of indium gallium arsenide (InGaAs). As such, if used as n-channel FETs, the first transistor 90 has a low threshold voltage, the second transistor 98 has a standard threshold voltage, and the third transistor 106 has a high threshold voltage.

Figure 14:
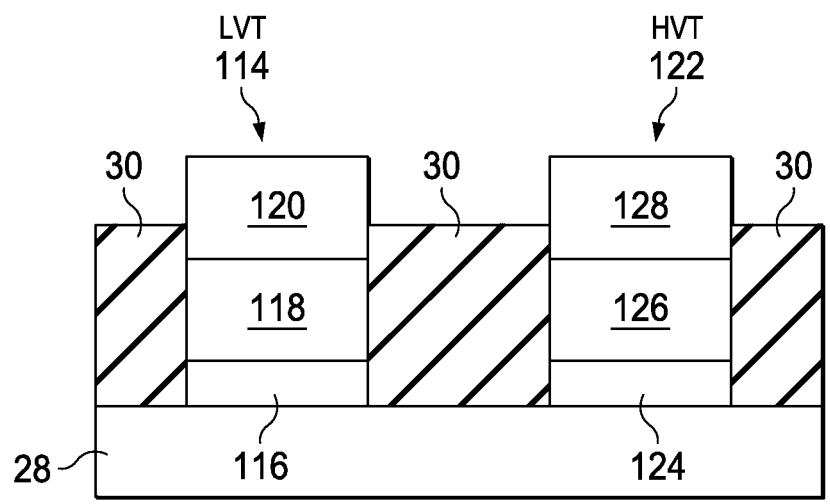
FIG. 14 illustrates an embodiment p-type FinFET.

Referring now to FIG. 14, several of the FinFETs 26 of FIG. 9 are illustrated. As shown, the first transistor 114 includes a template 116 of gallium antimonide (GaSb), a buffer 118 of aluminum antimonide, and a channel 120 of indium gallium antimonide (InGaSb). The second transistor 122 includes a template 124 of gallium antimonide (GaSb), a buffer 126 of indium aluminum antimonide with a particular composition (e.g., $In_xAl_{1-x}Sb$), and channel 128 of indium gallium antimonide (InGaSb). As such, if used as p-channel FETs, the first transistor 114 has a low threshold voltage and the second transistor 122 has a high threshold voltage.

Notably, the architecture noted above and illustrated in FIGS. 11-14 and elsewhere herein may be implemented in, for example, quantum well FETs or other planar devices as well.

Figure 15:
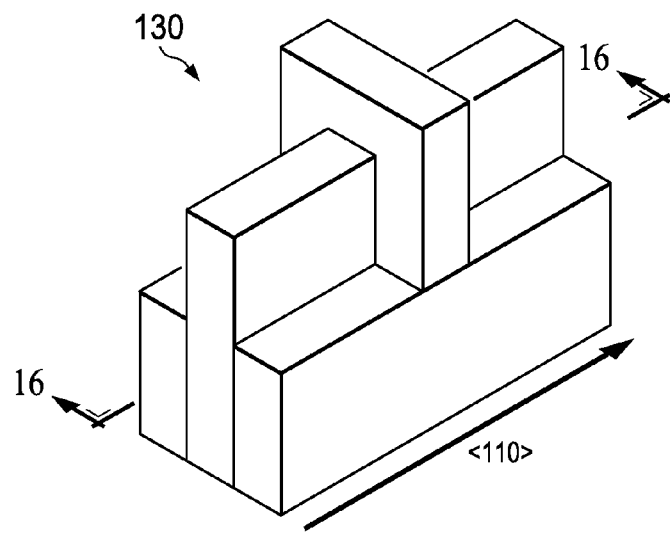
FIG. 15 illustrates a FinFET with a <110> crystal orientation in a direction corresponding to a length of the fin.

Referring now to FIG. 15, a FinFET 130 is illustrated. The FinFET 130 has a <110> crystal orientation in the direction indicated by the arrow.

Figure 16:
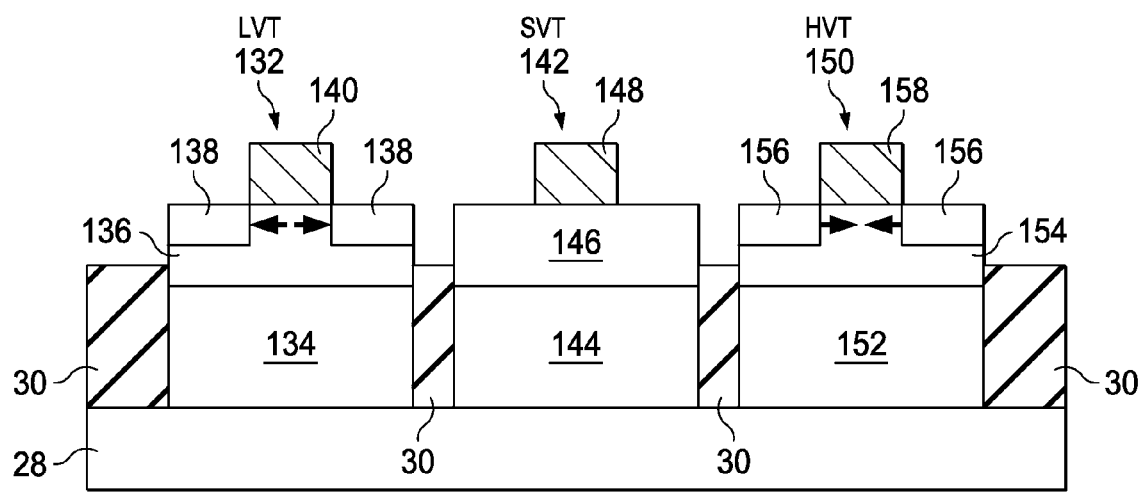
FIG. 16 illustrates a cross section of the FinFET of FIG. 15.

In FIG. 16, several of the FinFETs 130 of FIG. 15 are illustrated in cross section. As shown, the first transistor 132 includes a buffer 134, a channel 136, a source/drain region 138, and a gate 140. The second transistor 142 includes a buffer 144, a channel 146, and a gate 148. The third transistor 150 includes a buffer 152, a channel 154, a source/drain region 156, and a gate 158. Gates 140, 148, 158, may comprise an insulator and an electrode, e.g. a high-k dielectric, and a metal, respectively. As shown, the source/drain region 138, 156 in the first and third transistors 132, 150 is generally embedded in the channel 136, 154 and functions as a stressor. In an embodiment, the source/drain 138 stressor of the first transistor 132 provides tension while the source/drain 156 stressor of the third transistor 150 provides compression. Therefore, the first transistor 132 has a low threshold voltage, the second transistor 142 has a standard threshold voltage, and the third transistor 150 has a high threshold voltage.

Figure 17:
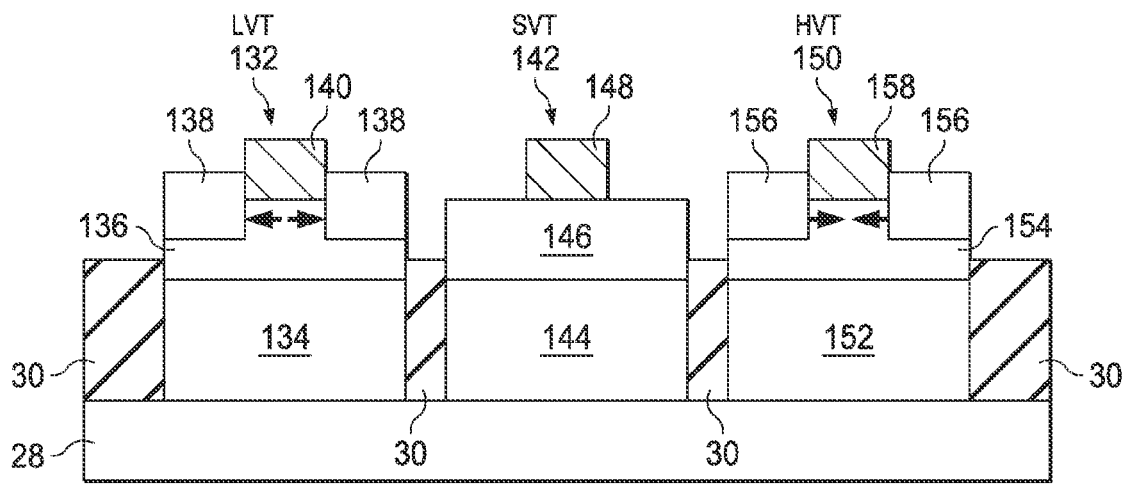
FIG. 17 illustrates a cross section of the FinFET of FIG. 15 with a thicker source/drain region.

Referring now to FIG. 17, in an embodiment the source/drain 138, 156 stressors have a top surface raised above a bottom surface of the gate 140, 158.

Figure 18:
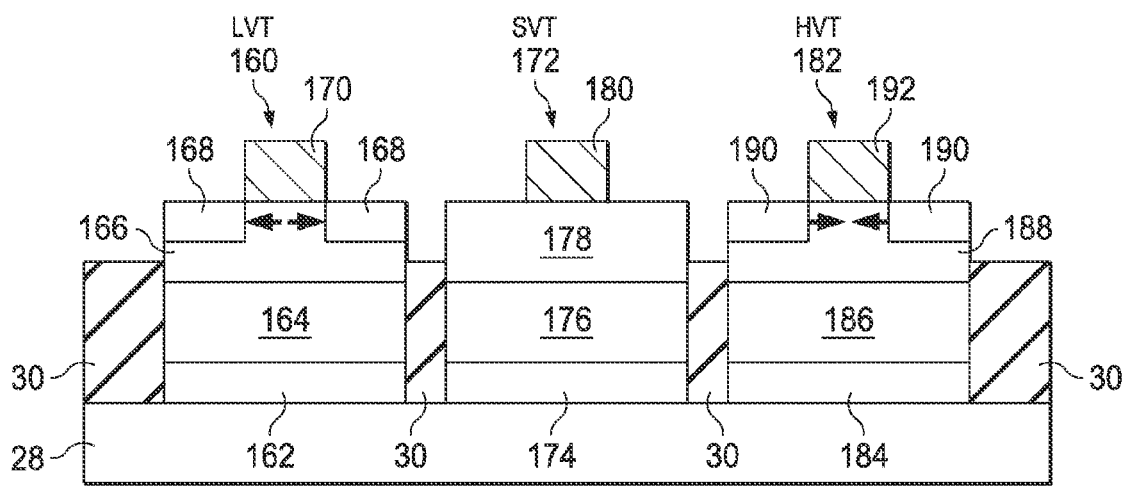
FIGS. 18-19 illustrate an embodiment n-type FinFET.

Referring now to FIG. 18, several of the FinFETs 130 of FIG. 15 are illustrated in cross section. As shown, the first transistor 160 includes a template 162 of indium phosphide (InP), a buffer 164 of indium aluminum arsenide with a particular composition (e.g., $In_{0.52}Al_{0.48}As$), a channel 166 of indium gallium arsenide with a particular composition ($In_xGa_{1-x}As$), a source/drain 168 stressor with a particular composition ($In_yGa_{1-y}As$ with y<x), and a gate 170. The second transistor 172 includes a template 174 of indium phosphide (InP), a buffer 176 of indium aluminum arsenide with a particular composition (e.g., $In_{0.52}Al_{0.48}As$), a channel 178 of indium gallium arsenide with a particular composition ($In_xGa_{1-x}As$), and a gate 180. The third transistor 182 includes a template 184 of indium phosphide (InP), a buffer 186 of indium aluminum arsenide with a particular composition (e.g., $In_{0.52}Al_{0.48}As$), a channel 188 of indium gallium arsenide with a particular composition ($In_xGa_{1-x}As$), a source/drain 190 stressor with a particular composition ($In_zGa_{1-z}As$, z>x), and a gate 192. As such, if used as n-channel FETS, the first transistor 160 has a low threshold voltage, the second transistor 172 has a standard threshold voltage, and the third transistor 182 has a high threshold voltage.

Figure 19:
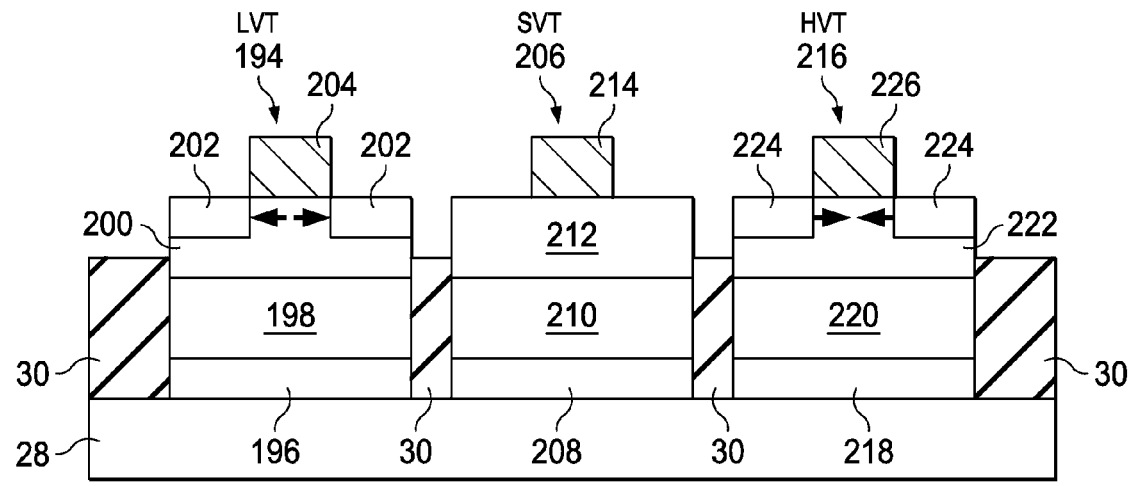

Referring now to FIG. 19, several of the FinFETs 130 of FIG. 15 are illustrated in cross section. As shown, the first transistor 194 includes a template 196 of indium arsenide (InAs), a buffer 198 of aluminum arsenide antimonide with a particular composition (e.g., $AlAs_{0.16}Sb_{0.84}$), a channel 200 of indium arsenide (InAs), a source/drain 202 stressor of indium gallium arsenide (InGaAs), and a gate 204. The second transistor 206 includes a template 208 of indium arsenide (InAs), a buffer 210 of aluminum arsenide antimonide with a particular composition (e.g., $AlAs_{0.16}Sb_{0.84}$), a channel 212 of indium arsenide (InAs), and a gate 214. The third transistor 216 includes a template 218 of indium arsenide (InAs), a buffer 220 of aluminum arsenide antimonide with a particular composition (e.g., $AlAs_{0.16}Sb_{0.84}$), a channel 222 of indium arsenide (InAs), a source/drain 224 stressor of indium arsenide antimonide (InAsSb), and a gate 226. As such, if used as n-channel FETs, the first transistor 194 has a low threshold voltage, the second transistor 206 has a standard threshold voltage, and the third transistor 216 has a high threshold voltage.

Figure 20:
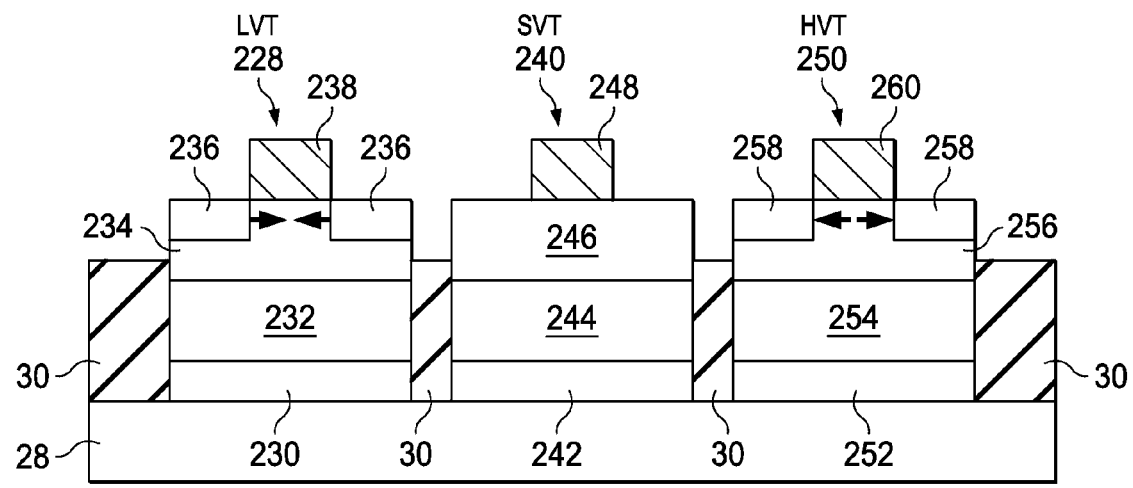
FIG. 20 illustrates an embodiment p-type FinFET.

Referring now to FIG. 20, several of the FinFETs 130 of FIG. 15 are illustrated in cross section. As shown, the first transistor 228 includes a template 230 of gallium antimonide (GaSb), a buffer 232 of aluminum antimonide (AlSb), a channel 234 of indium gallium antimonide with a particular composition (e.g., $In_xGa_{1-x}Sb$), a source/drain 236 stressor of indium gallium antimonide with a particular composition (e.g., $In_yGa_{1-y}Sb$ with y>x), and a gate 238. The second transistor 240 includes a template 242 of gallium antimonide (GaSb), a buffer 244 of aluminum antimonide (AlSb), a channel 246 of indium gallium antimonide with a particular composition (e.g., $In_xGa_{1-x}Sb$), and a gate 248. The third transistor 250 includes a template 252 of gallium antimonide (GaSb), a buffer 254 of aluminum antimonide (AlSb), a channel 256 of indium gallium antimonide with a particular composition (e.g., $In_xGa_{1-x}Sb$), a source/drain 258 stressor of indium gallium antimonide with a particular composition (e.g., $In_zGa_{1-z}Sb$ with z<x), and a gate 260. As such, if applied as p-channel PFETs, the first transistor 228 has a low threshold voltage, the second transistor 240 has a standard threshold voltage, and the third transistor 250 has a high threshold voltage.

Figure 21:
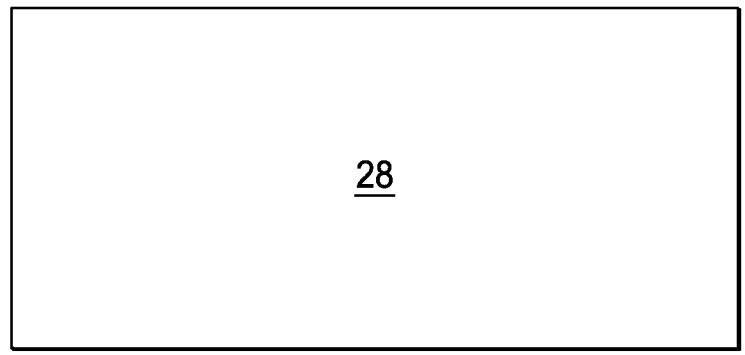
FIGS. 21-31 collectively illustrate an embodiment method of forming a multi-threshold voltage aspect ratio trapping (ART) FinFET.
Figure 22:
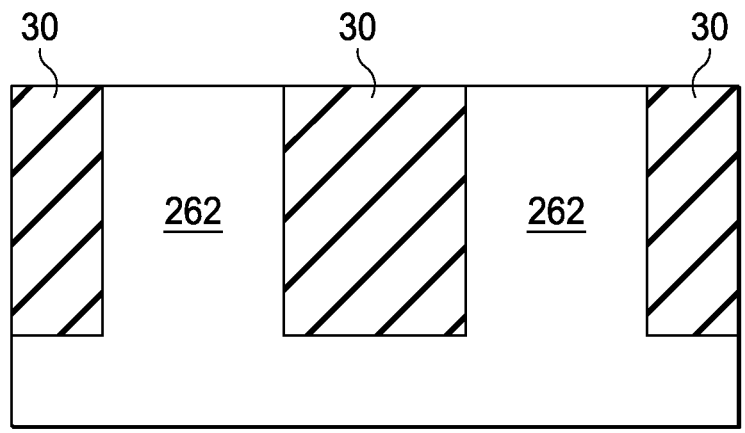
Figure 23:
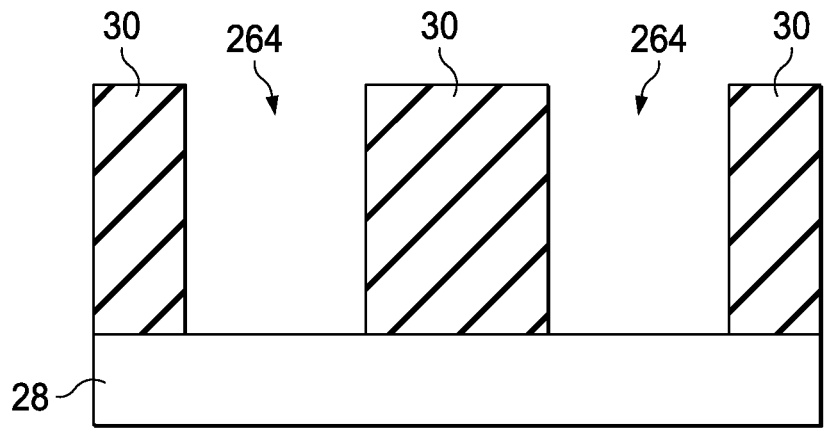
Figure 24:
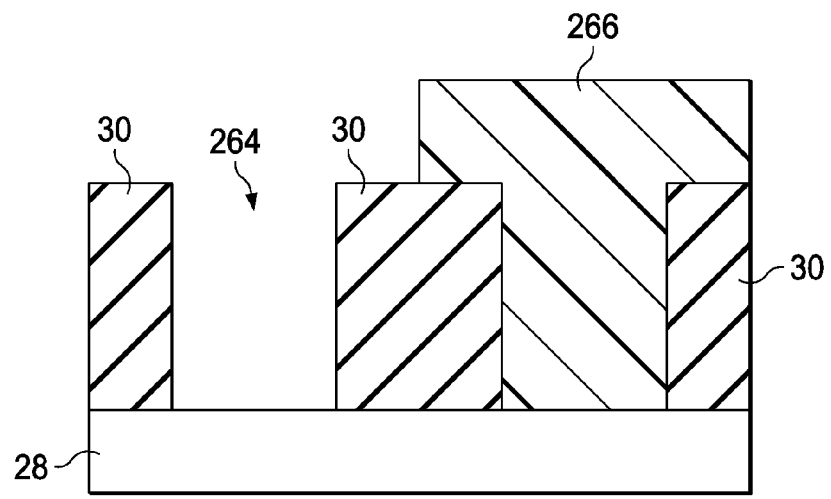
Figure 25:
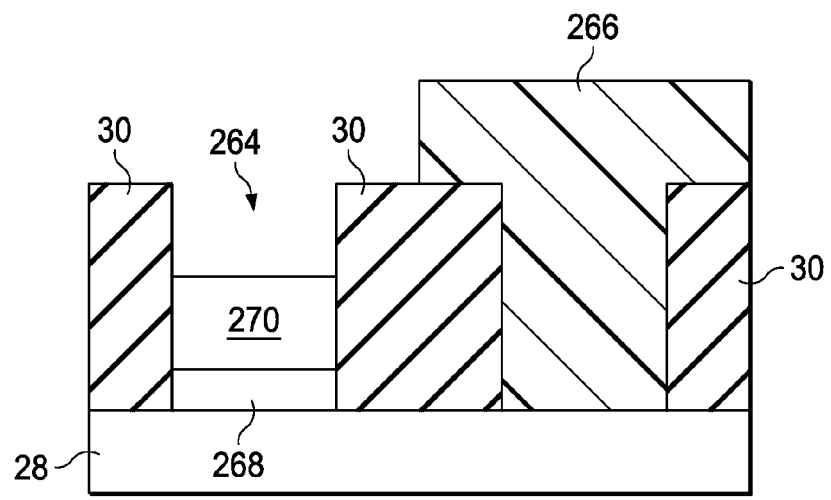
Figure 26:
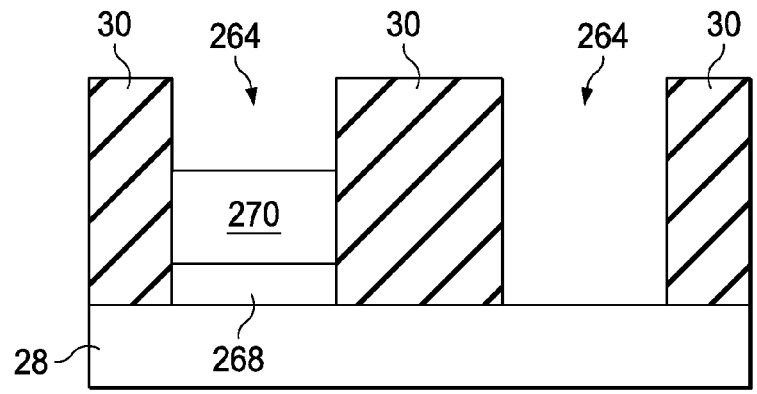
Figure 27:
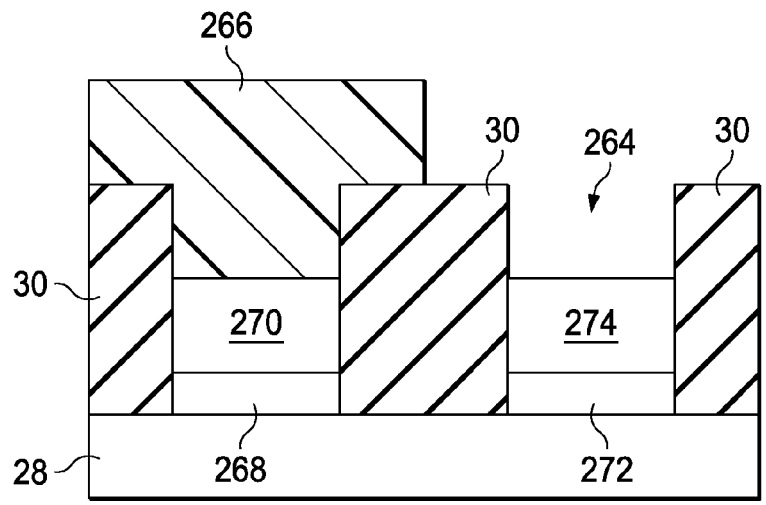

Referring collectively to FIGS. 21-31, an embodiment method of forming a multi-threshold voltage aspect ratio trapping (ART) FinFET device is generally described. In FIG. 21, a silicon substrate 28 is provided. In FIG. 22, active regions or fins 262, which are surrounded by isolation regions 30 (e.g., STI), may be formed using a standard process. In FIG. 23, the silicon is etched-back to open trenches 264. In FIG. 24, a first resist 266 is formed over one of the trenches 264. In FIG. 25, a first template 268 and a first buffer 270 are formed in the exposed trench. Thereafter, the resist 266 is removed as shown in FIG. 26. In FIG. 27, a second resist 266 is formed over the trench containing the first template 268 and the first buffer 270 and a second template 272 and a second buffer 274 are grown in the exposed trench.

Figure 28:
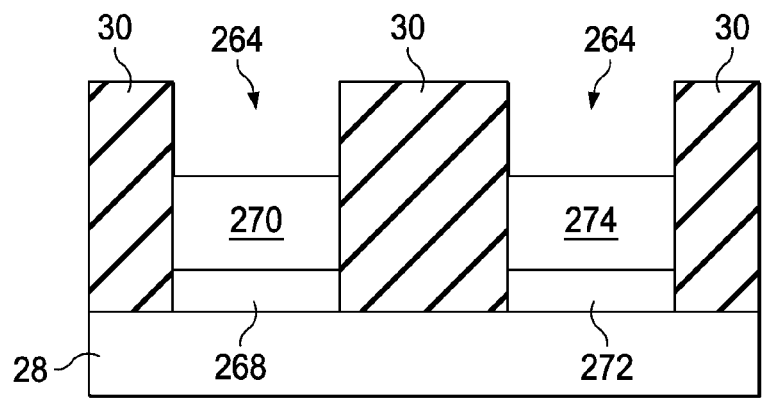
Figure 29:
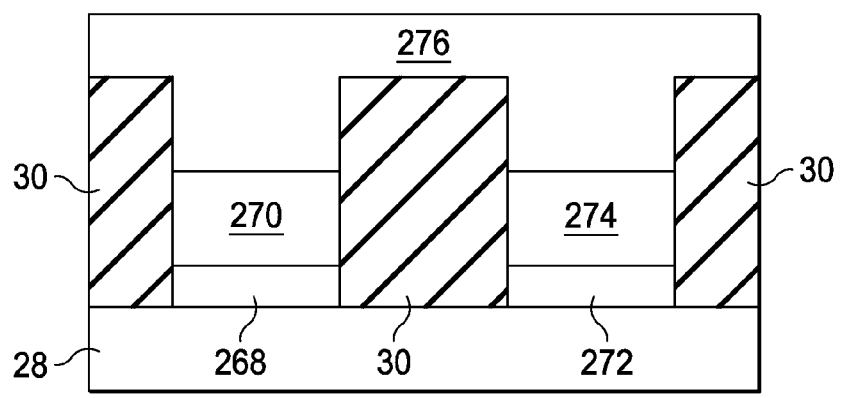
Figure 30:
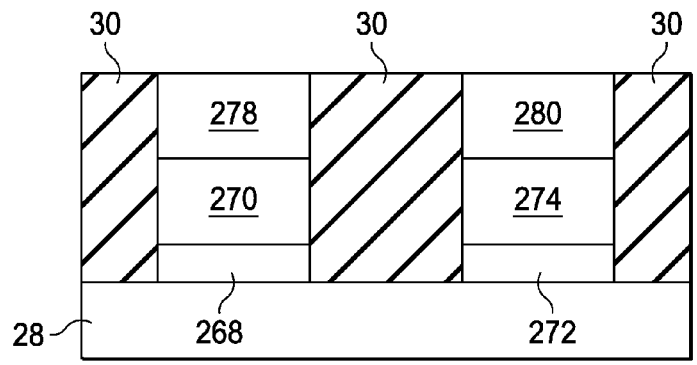
Figure 31:
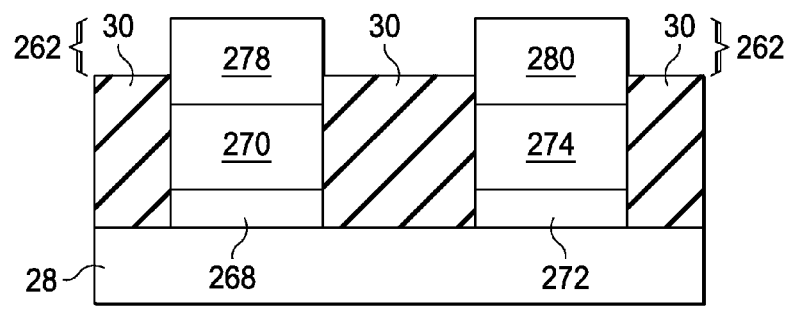
Figure 32:
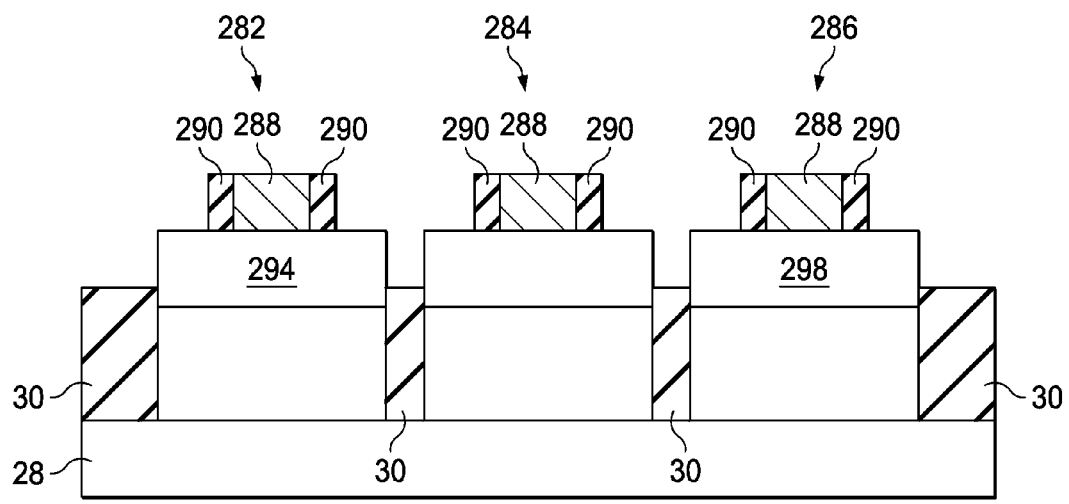
FIGS. 32-39 collectively illustrate an embodiment method of forming a multi-threshold voltage FinFET.

In FIG. 28, the resist 266 is removed. In FIG. 29, a channel material 276 is grown. As shown, the channel material 276 may be overgrown to provide for process margin. In FIG. 30, separate channels 278, 280 are defined by planarizing the channel material 276 using a chemical-mechanical polishing (CMP) process. In FIG. 31, the STI regions 30 are recessed to release the fins 262.

Figure 33:
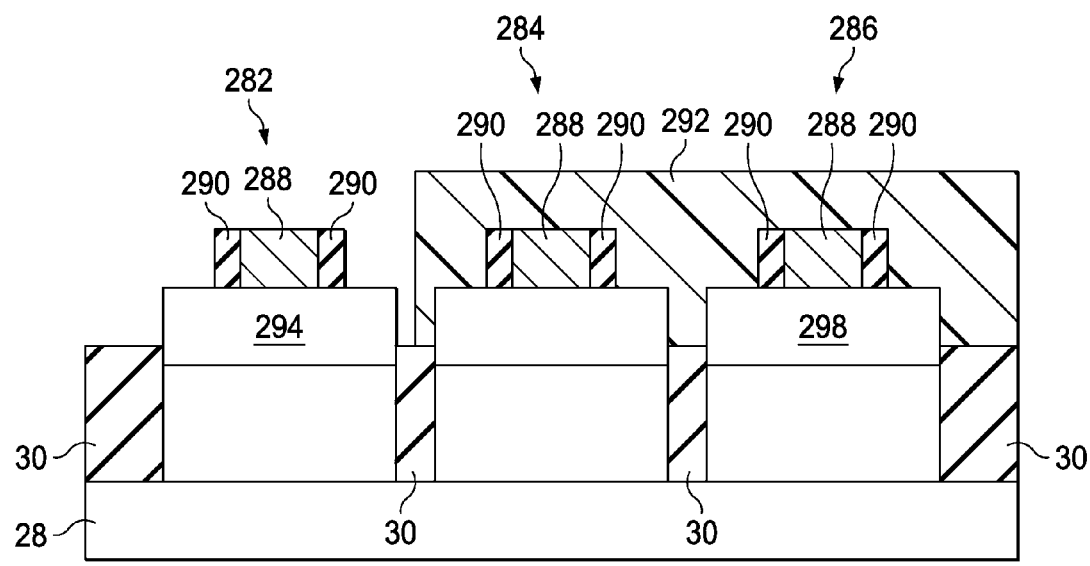

Referring collectively to FIGS. 32-39, an embodiment method of forming a multi-threshold voltage FinFET device is generally described. After the first transistor 282, the second transistor 284, and third transistor 286 have been formed generally using the method illustrated in FIGS. 21-31, the method begins with the formation of a gate 288 between opposing spacers 290 on each of the transistors. In FIG. 33, a resist 292 is formed over the second and third transistors 284, 286.

Figure 34:
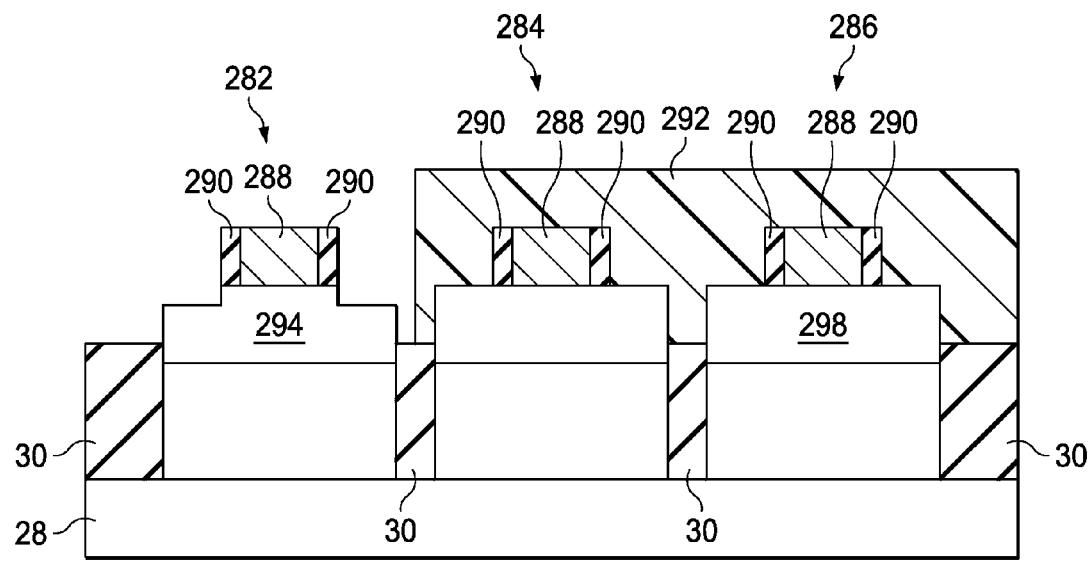
Figure 35:
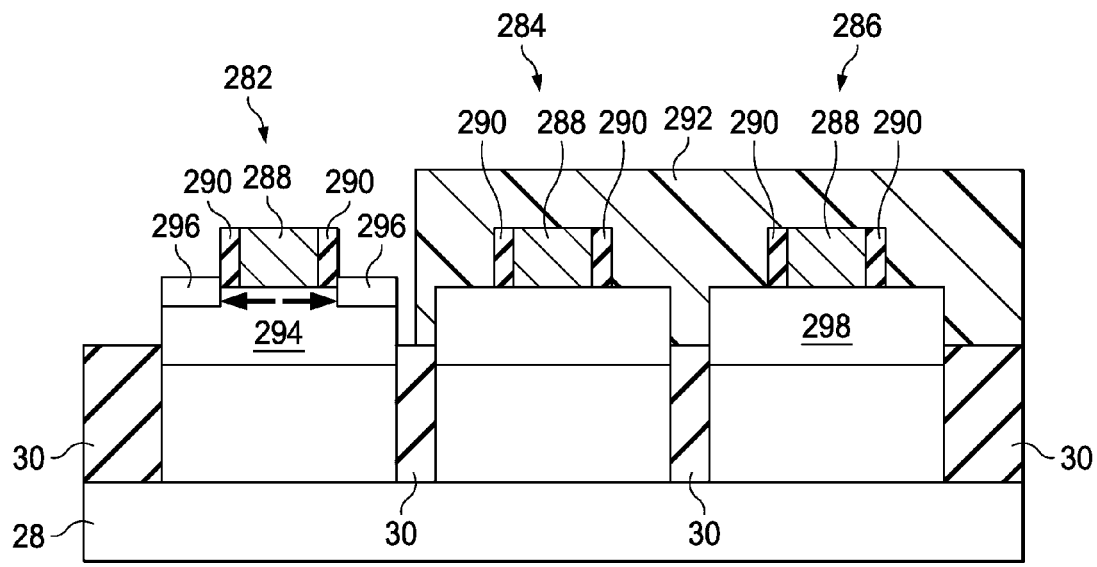
Figure 36:
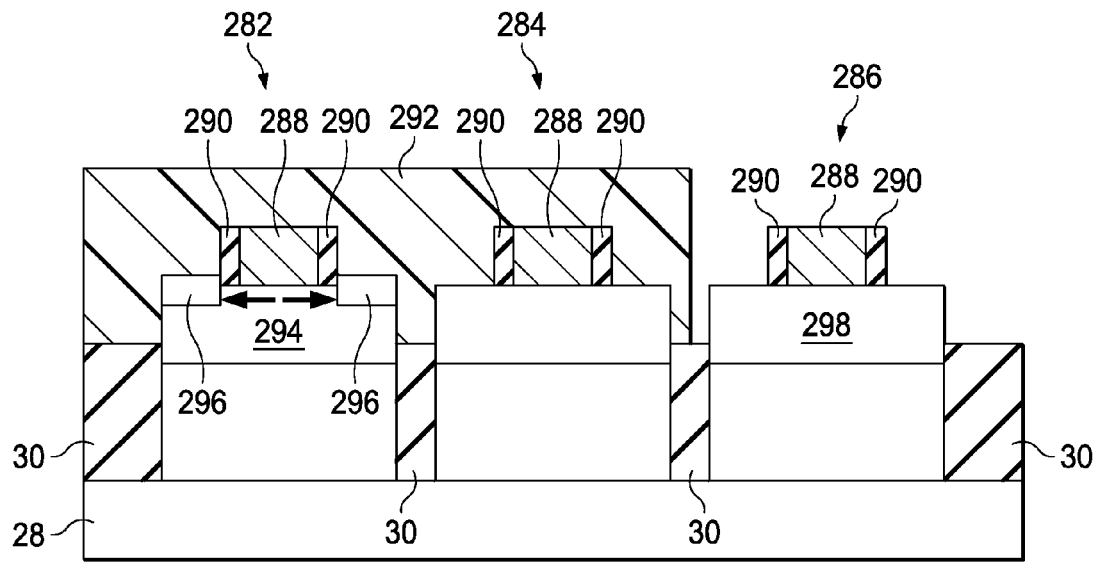
Figure 37:
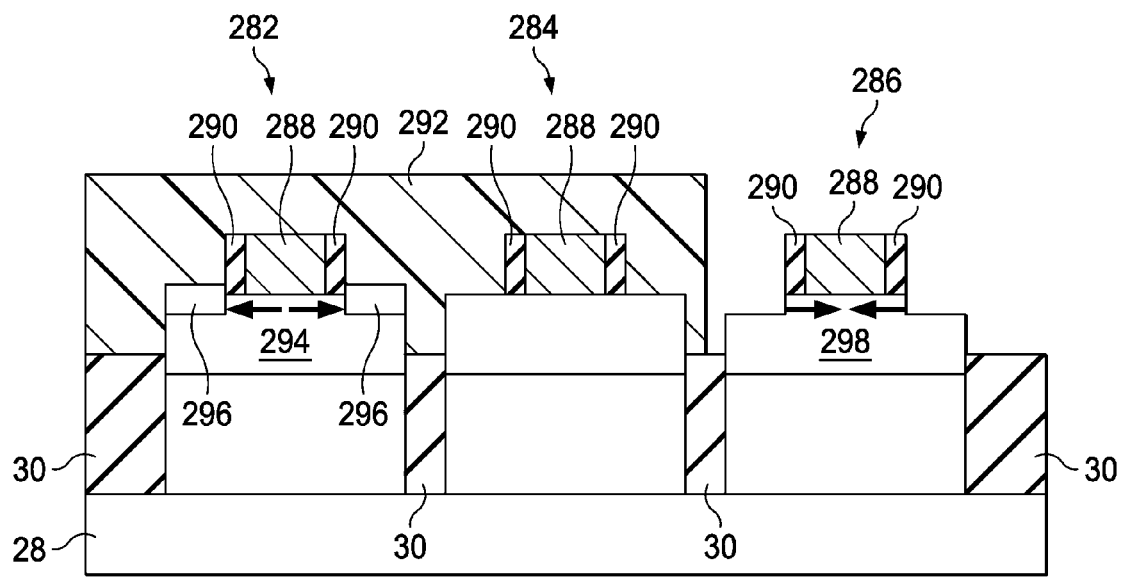
Figure 38:
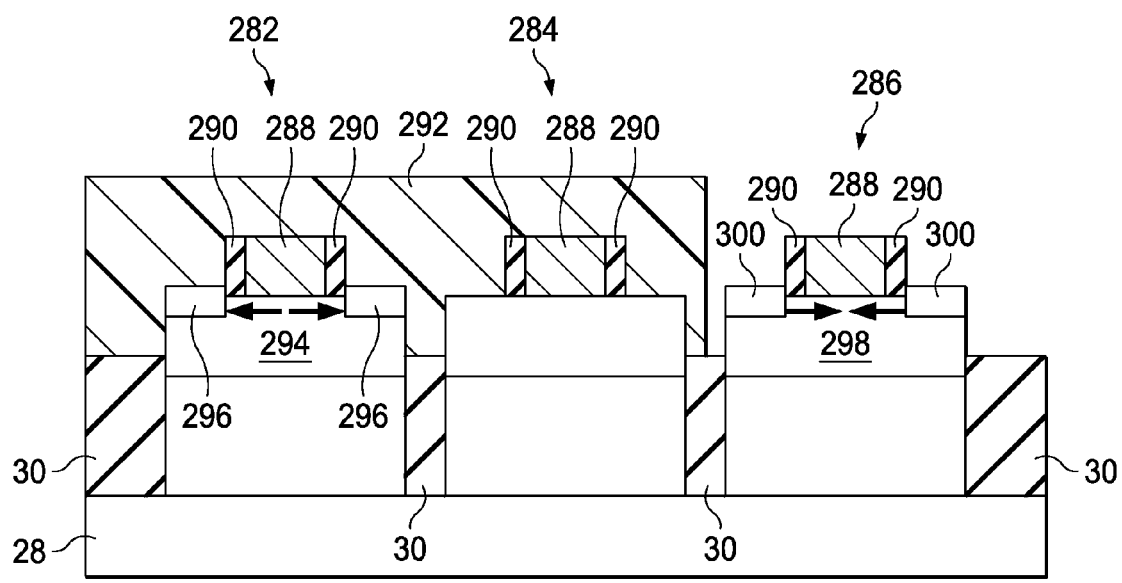
Figure 39:
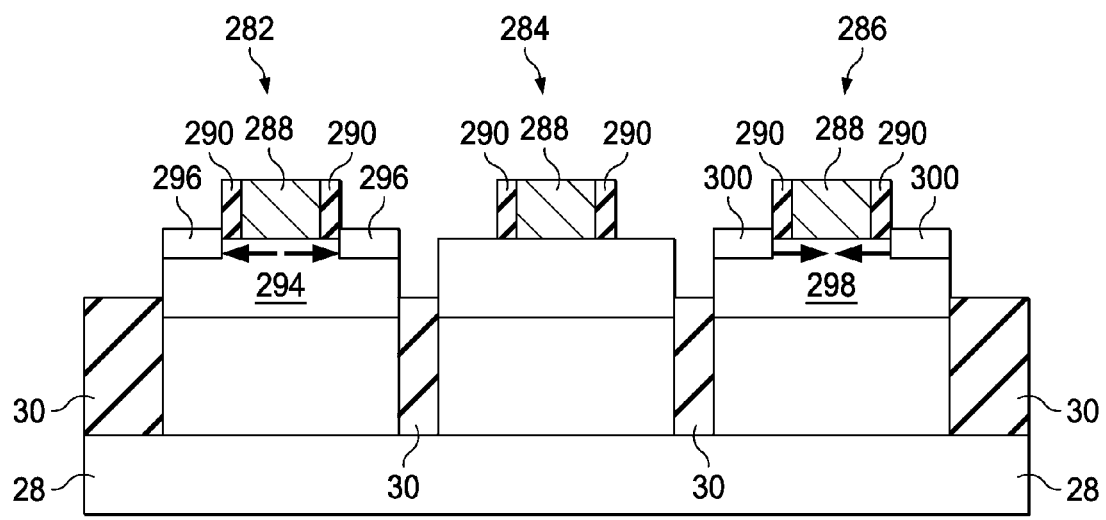

In FIG. 34, the channel 294 of the first transistor 282 is recessed. In an embodiment, the channel 294 is recessed using a dry etch process. Thereafter, in FIG. 35, a source/drain 296 stressor providing tensile stress is grown in the recessed channel 294 and then the resist 292 is removed. Next, in FIG. 36, another resist 292 is formed over the first and second transistors 282, 284. In FIG. 37, the channel 298 of the third transistor 286 is recessed. In an embodiment, the channel 298 is recessed using a dry etch process. Thereafter, in FIG. 38, a source/drain 300 stressor providing compressive stress is grown in the recessed channel 298. Then, in FIG. 39, the resist 292 is removed.

From the foregoing, it should be recognized that the methods disclosed herein provide an alternative to doping, work function tuning, gate length tuning, and the use of different channel materials when manufacturing a multiple threshold voltage transistor incorporating III-V compounds. Moreover, the method provides for a threshold voltage tuning range of between about 0.25 volts to about 0.5 volts for an n-type FET (NFET) by epitaxy-related (conduction) band structure engineering. The same principle is applicable to threshold voltage tuning for a p-type FET (PFET) based on valence band structure engineering.

An embodiment integrated circuit device includes a first transistor including airst channel region over a first buffer, the first channel region formed from a III-V semiconductor material, and a second transistor including a second channel region over a second buffer, the second channel region formed from the III-V semiconductor material, the second buffer and the first buffer having a lattice mismatch.

An embodiment integrated circuit device includes a first transistor including a first channel region over a first buffer, the first channel region formed from a III-V semiconductor material, the first buffer formed from a first buffer material, and a second transistor including a second channel region over a second buffer, the second channel region formed from the III-V semiconductor material, the second buffer formed from a second buffer material different from the first buffer material, wherein a first strain introduced by a lattice mismatch between the III-V semiconductor material and the first buffer is different than a second strain introduced by a lattice mismatch between the III-V semiconductor material and the second buffer.

An embodiment integrated circuit device includes a first transistor including a first channel region over a first buffer, the first channel region formed from a III-V semiconductor material, the first buffer formed from a first buffer material, a second transistor including a second channel region over a second buffer, the second channel region formed from the III-V semiconductor material, the second buffer formed from a second buffer material different from the first buffer material, a first source/drain stressor embedded in the first channel on opposing sides of a first gate, and a second source/drain stressor embedded in the second channel on opposing sides of a second gate.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. An integrated circuit device comprising:
   a first transistor including a first strained channel region, the first strained channel region disposed between first source/drain regions, the first source/drain regions formed from a first III-V semiconductor material; and
   a second transistor including a second strained channel region, the first strained channel region and the second strained channel region being subjected to opposite strains, the second strained channel region disposed between second source/drain regions, the second source/drain regions formed from a second III-V semiconductor material, the first III-V semiconductor material and the second III-V semiconductor material being a same material with different stoichiometric ratios, wherein the first strained channel region and the second strained channel region comprises a same III-V semiconductor material having a same stoichiometric ratio, and wherein the first transistor and the second transistor are each an n-type field effect transistor (FET).

2. The integrated circuit device of claim 1, wherein the n-type field effect transistor is one of a fin field effect transistor (FinFET) and a quantum well field effect transistor (QWFET).

3. The integrated circuit device of claim 1, wherein the first III-V semiconductor material and the second III-V semiconductor material is indium gallium arsenide.

4. The integrated circuit device of claim 1, further comprising a first buffer underlying the first strained channel region and a second buffer underlying the second strained channel region.

5. The integrated circuit device of claim 4, wherein the first buffer is disposed on a first template and the second buffer is disposed on a second template, each of the first template and the second template comprising indium phosphorous.

6. The integrated circuit device of claim 4, wherein the first buffer and the second buffer are formed of a same material.

7. The integrated circuit device of claim 6, wherein the first buffer and the second buffer is formed of indium aluminum arsenide.

8. The integrated circuit device of claim 1, wherein the first strained channel region and the second strained channel region is formed of a third III-V semiconductor material, the first III-V semiconductor material and the third III-V semiconductor material being a same material with different stoichiometric ratios.

9. The integrated circuit device of claim 8, wherein the first III-V semiconductor material, the second III-V semiconductor material, and the third III-V semiconductor material is indium gallium arsenide, the first III-V semiconductor material having a lower concentration of indium than the third III-V semiconductor material, the second III-V semiconductor material having a higher concentration of indium than the third III-V semiconductor material.

10. The integrated circuit device of claim 8, wherein the first III-V semiconductor material, the second III-V semiconductor material, and the third III-V semiconductor material is indium gallium antimonide, the first III-V semiconductor material having a lower concentration of indium than the third III-V semiconductor material, the second III-V semiconductor material having a higher concentration of indium than the third III-V semiconductor material.

11. The integrated circuit device of claim 1, wherein the first III-V semiconductor material and the second III-V semiconductor material is indium gallium antimonide.

12. An integrated circuit device, comprising:
   a first transistor including a first channel region over a first buffer, the first channel region formed of a first channel material, the first channel region interposed between first source/drain regions, the first source/drain regions formed of a first III-V semiconductor material, the first channel region formed from a first channel material; and
   a second transistor including a second channel region over a second buffer, the second channel region formed of a second channel material, the second channel region interposed between second source/drain regions, the second source/drain regions formed of a second III-V semiconductor material, the first III-V semiconductor material and the second III-V semiconductor material comprising a same type of elements with different chemical formulas, the first transistor and the second transistor being field effect transistors of a same conductivity type;

wherein one of the first channel region and the second channel region is subjected to a compressive strain, and another of the first channel region and the second channel region is subjected to a tensile strain;

wherein a first strain introduced by a lattice mismatch between the first III-V semiconductor material and the first channel material is different than a second strain introduced by a lattice mismatch between the second III-V semiconductor material and the second channel material; and wherein the first channel material and the second channel material comprise a same III-V semiconductor material having a same ratio of elements.

13. The integrated circuit device of claim 12, wherein the first III-V semiconductor material has a lower concentration of indium than the second III-V semiconductor material.

14. The integrated circuit device of claim 12, wherein the first III-V semiconductor material, the second III-V semiconductor material, the first channel material, and the second channel material comprises indium and gallium, the first III-V semiconductor material having a lower concentration of indium than the first channel material, the second III-V semiconductor material having a higher concentration of indium that the second channel material.

15. The integrated circuit device of claim 12, wherein the first buffer and the second buffer is formed of indium aluminum arsenide.

16. An integrated circuit device comprising:
a first transistor including a first channel over a first buffer, first source/drain regions on opposing sides of the first channel, the first source/drain regions formed of a first III-V semiconductor material, the first channel formed of a second III-V semiconductor material, the first transistor having a first threshold voltage; and a second transistor including a second channel over a second buffer, second source/drain regions on opposing sides of the second channel, the second source/drain regions formed of a third III-V semiconductor material, the second channel formed of a fourth III-V semiconductor material, the first transistor and the second transistor being field effect transistors of a same conductivity type, the second transistor having a second threshold voltage, the first threshold voltage being different from the second threshold voltage, the first channel and the second channel being subjected to opposite strains;

wherein the first III-V semiconductor material, the second III-V semiconductor material, and the third III-V semiconductor material having a same combination of elements with differing chemical formulas; and wherein the second III-V semiconductor material and the fourth III-V semiconductor material have a same chemical formula.

17. The integrated circuit device of claim 16, wherein the first III-V semiconductor material, the second III-V semiconductor material, the third III-V semiconductor material, and the fourth III-V semiconductor material is indium gallium arsenide.

18. The integrated circuit device of claim 16, wherein the first III-V semiconductor material has a lower concentration of indium than the second III-V semiconductor material, and wherein the third III-V semiconductor material has a higher concentration of indium than the second III-V semiconductor material.

19. The integrated circuit device of claim 16, wherein the first III-V semiconductor material and the second III-V semiconductor material is indium gallium antimonide.

20. The integrated circuit device of claim 1, wherein the second transistor has a higher threshold voltage than the first transistor.

* * * * *